United States Patent
Bacchi et al.

[19]

[11] Patent Number: 6,155,768
[45] Date of Patent: Dec. 5, 2000

[54] MULTIPLE LINK ROBOT ARM SYSTEM IMPLEMENTED WITH OFFSET END EFFECTORS TO PROVIDE EXTENDED REACH AND ENHANCED THROUGHPUT

[75] Inventors: Paul Bacchi, Novato; Paul S. Filipski, Greenbrae, both of Calif.

[73] Assignee: Kensington Laboratories, Inc., Richmond, Calif.

[21] Appl. No.: 09/016,021

[22] Filed: Jan. 30, 1998

[51] Int. Cl.[7] .................................................. B65G 49/07
[52] U.S. Cl. ...................... 414/416; 414/744.5; 414/937; 414/941
[58] Field of Search ................................ 414/744.5, 749, 414/752, 225, 416, 937, 939, 941; 901/8, 15, 21, 23, 40; 74/490.01, 490.03, 490.04; 118/719; 204/298.25

[56] References Cited

U.S. PATENT DOCUMENTS

| | | | |
|---|---|---|---|
| 2,811,267 | 10/1957 | Bock | 414/744.5 |
| 3,010,587 | 11/1961 | Hollinger | 414/744.5 |
| 4,065,001 | 12/1977 | Ohnaka . | |
| 4,299,533 | 11/1981 | Ohnaka | 414/752 |
| 4,392,766 | 7/1983 | Blunt | 901/40 |
| 4,435,118 | 3/1984 | Behrend et al. | 414/744.5 |
| 4,457,664 | 7/1984 | Judell et al. | 414/779 |
| 4,661,040 | 4/1987 | Cigna | 414/744.5 |
| 4,702,668 | 10/1987 | Carlisle et al. | 414/744.5 |
| 4,705,951 | 11/1987 | Layman et al. | 414/937 |
| 4,787,813 | 11/1988 | Stevens et al. | 414/744.5 |
| 4,813,846 | 3/1989 | Helms | 414/744.1 |
| 4,897,015 | 1/1990 | Abbe et al. | 414/744.8 |
| 4,923,054 | 5/1990 | Ohtani et al. | 414/941 |
| 5,007,784 | 4/1991 | Genov et al. | 414/941 |
| 5,013,210 | 5/1991 | Bond | 414/749 |
| 5,064,340 | 11/1991 | Genov et al. | 414/744.5 |
| 5,083,896 | 1/1992 | Uehara et al. | 414/744.5 |
| 5,096,364 | 3/1992 | Messer et al. | 414/744.5 |
| 5,102,280 | 4/1992 | Poduje et al. | 414/225 |
| 5,147,175 | 9/1992 | Tada | 414/749 |
| 5,151,008 | 9/1992 | Ishida et al. | 414/749 |
| 5,178,512 | 1/1993 | Skrobak | 414/749 |
| 5,306,380 | 4/1994 | Hiroki | 414/937 |
| 5,314,294 | 5/1994 | Taniguchi et al. | 414/744.5 |
| 5,456,561 | 10/1995 | Poduje et al. | 414/749 |
| 5,509,772 | 4/1996 | Doche | 414/937 |
| 5,513,946 | 5/1996 | Sawada et al. | 414/744.5 |
| 5,513,948 | 5/1996 | Bacchi et al. | 414/783 |
| 5,534,761 | 7/1996 | Crippa | 414/744.5 |
| 5,571,325 | 11/1996 | Ueyama et al. | 414/935 |
| 5,584,647 | 12/1996 | Uehara et al. | 414/744.5 |
| 5,587,637 | 12/1996 | Ohyama | 901/23 |
| 5,667,354 | 9/1997 | Nakazawa | 414/744.5 |
| 5,697,749 | 12/1997 | Iwabuchi et al. | 414/937 |
| 5,720,590 | 2/1998 | Hofmeister | 414/744.5 |
| 5,730,574 | 3/1998 | Adachi et al. | 414/937 |
| 5,741,113 | 4/1998 | Bacchi et al. | 414/744.5 |
| 5,765,444 | 6/1998 | Bacchi et al. | 414/744.5 |
| 5,944,476 | 8/1999 | Bacchi et al. | 414/783 |
| 5,951,770 | 9/1999 | Perlov et al. | 414/937 |

FOREIGN PATENT DOCUMENTS

| | | | |
|---|---|---|---|
| 3511531 | 10/1986 | Germany | 414/744.5 |
| 2-100887 | 4/1990 | Japan | 414/744.5 |
| 2-237782 | 9/1990 | Japan | 414/744.5 |

*Primary Examiner*—Robert P. Olszewski
*Assistant Examiner*—Thuy V. Tran
*Attorney, Agent, or Firm*—Stoel Rives LLP

[57] ABSTRACT

Two multiple link robot arms (10) are mounted to a torso link (11), and each of them includes an offset hand (30) and two motors (50, 52) capable of independent operation that provides movement of the offset hand along along combinations of angular, radial, linear, and curvilinear paths. The first motor rotates a forearm (22) about an elbow axis (24), and the second motor rotates an upper arm (14) about a shoulder axis (16). A motor controller (54) controls the first and second motors in two operational states that respectively enable linear extension or retraction of the robot arm radial to the shoulder axis and enable angular displacement of the hand about the shoulder axis. A distal end (34) of each offset hand is offset such that during first operational state motion, the distal end follows paths parallel to lines radial to the shoulder axis. The offset distance (240) is set so that when properly rotated in the second operational state, both offset hands can follow a common hand extension line (44) that is a perpendicular bisector between the shoulder axes of the robot arms. This allows specimens (206) retrieved by either offset hand to be placed on a processing station (208) located along the hand extension line.

29 Claims, 10 Drawing Sheets

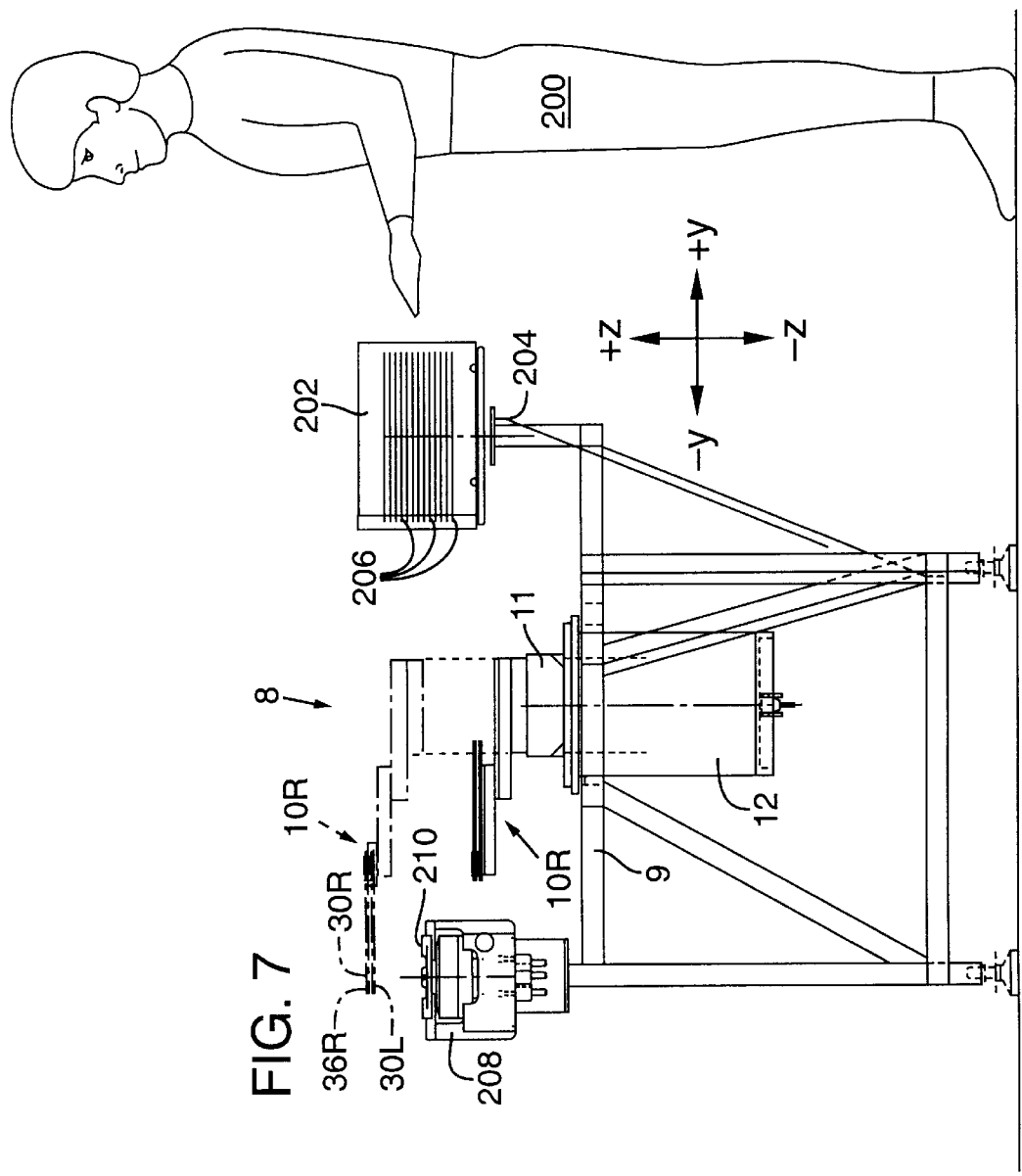

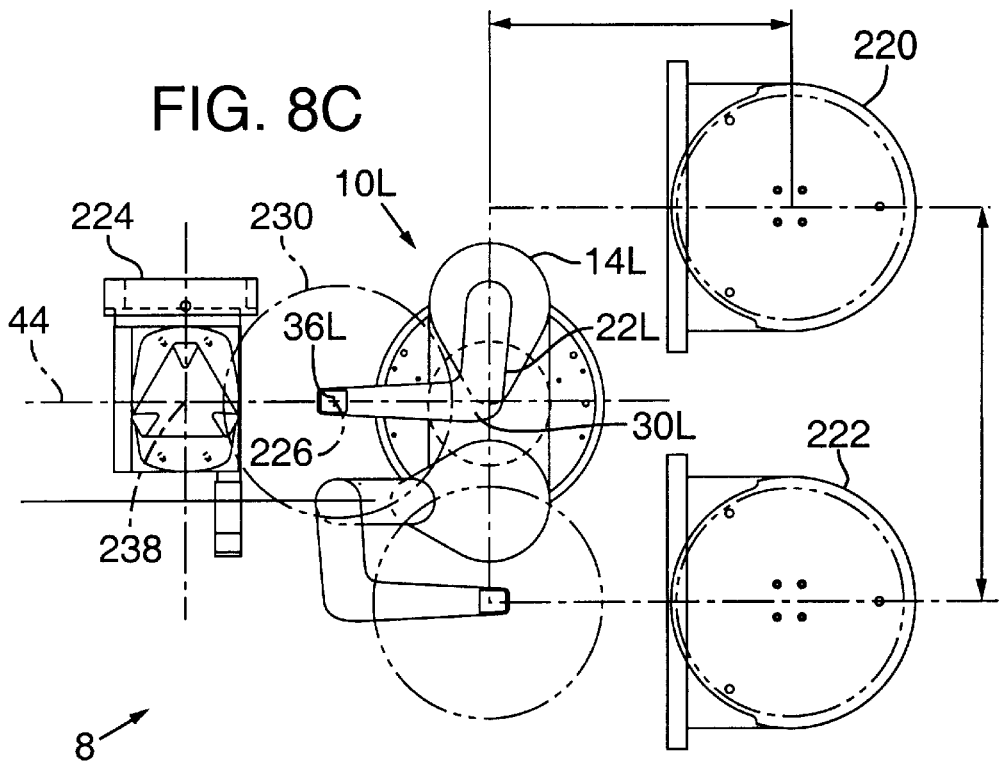
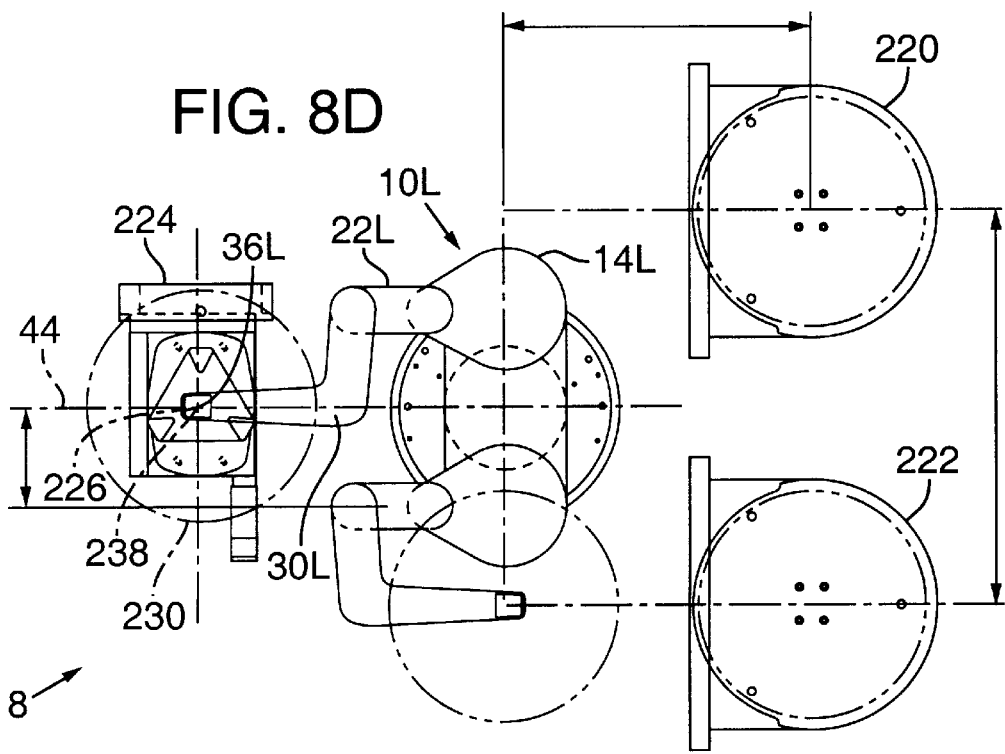

MULTIPLE LINK ROBOT ARM SYSTEM IMPLEMENTED WITH OFFSET END EFFECTORS TO PROVIDE EXTENDED REACH AND ENHANCED THROUGHPUT

TECHNICAL FIELD

This invention relates to robot arm mechanisms and, in particular, to a continuously rotatable multiple link robot arm system implemented with dual offset end effectors that provide extended reach and improved specimen handling throughput.

BACKGROUND OF THE INVENTION

Currently available robot arm mechanisms include pivotally joined multiple linear links that are driven by a first motor and are mechanically coupled to effect straight line movement of an end effector or hand along radial directions from a central axis. Such robot arm mechanisms are also equipped with a second, independently operating motor to angularly displace the hand about the central axis. Certain robot arm mechanisms are equipped with telescoping mechanisms that move the hand also in a direction perpendicular to the plane of straight line movement and angular displacement of the hand. The hand is provided with a vacuum outlet that secures a specimen, such as a semiconductor wafer, computer hard disk, or compact disk, to the hand as it transports the specimen between processing stations.

U.S. Pat. No. 4,897,015 of Abbe et al. describes a rotary-to-linear motion robot arm that uses a first motor to control a multi-linkage robot arm to produce straight line radial motion from motor-driven rotary motion. An additional motor may be coupled to the robot arm for operation independent of that of the first motor to angularly move the multi-linkage robot arm without radial motion. Because they independently produce radial motion and angular motion, the first and second motors produce useful robot arm movement when either one of them is operating.

The robot arm of the Abbe et al. patent extends and retracts an end effector (or a hand) along a straight line path by means of a mechanism that pivotally couples in a fixed relationship a first arm (or forearm) and a second (or upper) arm so that they move in predetermined directions in response to rotation of the upper arm. To achieve angular displacement of the hand, a Θ drive motor rotates the entire robot arm structure. The Abbe et al. patent describes no capability of the robot arm to reach around corners or travel along any path other than a straight line or a circular segment defined by a fixed radius.

U.S. Pat. No. 5,007,784 of Genov et al. describes a robot arm with an end effector structure that has two oppositely extending hands, each of which is capable of picking up and transporting a specimen. The end effector structure has a central portion that is centrally pivotally mounted about the distal end of a second link or forearm. The extent of pivotal movement about all pivot axes is purposefully limited to prevent damage to vacuum pressure flexible conduits resulting from kinking or twisting caused by over-rotation in a single direction.

The coupling mechanism of a first link or upper arm, the forearm, and the end effector structure of the robot arm of the Genov et al. patent is more complex than that of the robot arm of the Abbe et al. patent. Nevertheless, the robot arm structures of the Abbe et al. and Genov et al. patents operate similarly in that each of the end effector structures picks up and transports specimens by using one motor to extend and retract a hand and another, different motor to rotate the entire robot arm structure to allow the hand to extend and retract at different ones of a restricted number of angular positions extending radially from a central axis.

Robot arms of the type described by the Abbe et al. and Genov et al. patents secure a specimen to the hand by means of vacuum pressure delivered to the hand through fluid conduits extending through the upper arm, forearm, and hand and around all of the pivot axes. The Abbe et al. patent is silent about a vacuum pressure delivery system, and the Genov et al. patent describes the use of flexible fluid conduits. The presence of flexible fluid conduits limits robot arm travel path planning because unidirectional robot arm link rotation about the pivot axes "winds up" the conduits and eventually causes them to break. Thus, conduit breakage prevention requirements prohibit continuous robot arm rotation about any of the pivot axes and necessitate rewind maneuvers and travel path "lockout" spaces as part of robot arm travel path planning. The consequences of such rewind maneuvers are more complex and limited travel path planning, reduced throughput resulting from rewind time, and reduced available work space because of the lockout spaces.

Moreover, subject to lockout space constraints, commercial embodiments of such robot arms have delivered specimens to and retrieve specimens from stations angularly positioned about paths defined only by radial distances from the axes of rotation of the robot arms. Thus, the robot arm structures described by the Abbe et al. and Genov et al. patents are incapable of transporting specimens between processing stations positioned in compact, irregularly shaped working spaces. For example, neither of these robot arm structures is set up to remove specimen wafers from and place specimen wafers in wafer cassettes having their openings positioned side-by-side in a straight line arrangement of a tightly packed working space.

SUMMARY OF THE INVENTION

An object of the invention is, therefore, to provide a multiple link robot arm system that has straight line motion, extended reach, corner reacharound, and continuous bidirectional rotation capabilities for transporting specimens to virtually any location in an available work space that is free of lockout spaces.

Another object of the invention is to provide such a system that increases specimen processing throughput in the absence of robot arm rewind time and radial positioning of processing station requirements.

A further object of this invention is to provide such a system that is capable of continuous rotation in either direction with no susceptibility to kinking, twisting, or breaking of conduits delivering vacuum pressure to the hand.

Still another object of the invention is to provide such a system that uses two motors capable of synchronous operation and a linkage coupling mechanism that permit a hand of an end effector structure to change its extension as the multiple link robot arm mechanism to which the hand is associated changes its angular position.

A preferred embodiment of this invention comprises two multiple link robot arm mechanisms mounted on a torso link that is capable of 360 degree rotation about a central or "torso" axis. Each robot arm mechanism includes an end effector having an offset (boomerang shaped) hand. Each multiple link robot arm mechanism uses two motors capable of independent and/or synchronized operation to move the offset hand along a curvilinear or linear paths. A first motor rotates a forearm about an elbow axis that extends through distal and proximal ends of the upper arm and forearm, respectively, and a second motor rotates an upper arm about a shoulder axis that extends through a proximal end of the upper arm. A mechanical linkage couples the upper arm and the forearm and forms an active drive link and a passive drive link. The active drive link operatively connects the first motor and the forearm to cause the forearm to rotate about the elbow axis in response to the first motor. The passive drive link operatively connects the forearm and the offset hand causing it to rotate about a wrist axis in response to rotation of the forearm about the elbow axis. The wrist axis extends through distal and proximal ends of the forearm and hand, respectively.

A motor controller controls the first and second motors in two preferred operational states to enable the robot arm mechanism to perform two principal motion sequences. The first operational state maintains the position of the first motor and rotates the second motor so that the mechanical linkage causes linear displacement (i.e., extension or retraction) of the robot arm radial to the shoulder axis. The second operational state rotates the first and second motors so that the mechanical linkage causes angular displacement of the robot arm about the shoulder axis. The second operational state can provide an indefinite number of travel paths for the offset hand, depending on coordination of the control of the first and second motors.

Whenever the first and second motors move equal angular distances, the angular displacement of the upper arm about the shoulder axis and the angular displacement of the forearm about the elbow axis equally offset and thereby result in only a net angular displacement of the hand about the shoulder axis. Thus, under these conditions, there is no linear displacement of the hand and no rotation of the hand about the wrist axis. Whenever the first and second motors move different angular distances, the angular displacement of the upper arm about the shoulder axis and the angular displacement of the forearm about the elbow axis only partly offset and thereby result in angular displacements of the hand about the shoulder and wrist axes and consequently a linear displacement of the hand. Coordination of the position control of the first and second motors enables the robot arm mechanism to describe a compound curvilinear path of travel for the hand.

A distal end of each offset hand is offset such that during first operational state motion, the distal end follows paths parallel to lines radial to the shoulder axis. The amount of offset is set so that when properly rotated in the second operational state, the offset hands of both robot arms can follow a common hand extension line that is a perpendicular bisector between the shoulder axes of the robot arms. This allows specimens retrieved by either offset hand to be placed on a processing station located along the hand extension line.

A third or torso motor rotates the torso link about the central axis, which extends through the center of the torso link and is equidistant from the shoulder axes of the robot arm mechanisms. The motor controller controls the operation of the torso motor to permit rotation of the torso link independent of the motion of the robot arm mechanisms mounted to it. The presence of the rotatable torso link together with the independent offset hand motion permits various nonradial or radial positionings of specimen storage and/or processing stations relative to the torso axis. The consequence is a high speed, high throughput robot arm system that operates in a compact work space.

Each of the robot arm mechanisms is equipped with a rotary fluid slip ring acting as a fluid feedthrough conduit. These slip rings permit the hand to rotate continuously as the robot arm links rotate about the shoulder, elbow, and wrist axes without a need to unwind to prevent kinking or twisting of conventional fluid pressure lines. Moreover, the offset hands of the robot arms are spaced apart vertically to allow continuous rotation without mechanical interference from one another in the region of the common hand extension line.

Additional objects and advantages of this invention will be apparent from the following detailed description of a preferred embodiment thereof which proceeds with reference to the accompanying drawings.

BRIEF DESCRIPTION OF THE DRAWINGS

FIG. 7 is a side elevation view of the robot arm system of FIGS. 1A and 1B shown as used in an exemplary semiconductor wafer processing application.

FIGS. 8A to 8D show various typical positions of the two-arm, multiple link robot arm system of FIGS. 1A and 1B as it retrieves semiconductor wafers from two optimally spaced apart, side-by-side wafer cassettes and without torso link rotation places the wafers at a processing station location.

DETAILED DESCRIPTION OF PREFERRED EMBODIMENT

Figure 1:
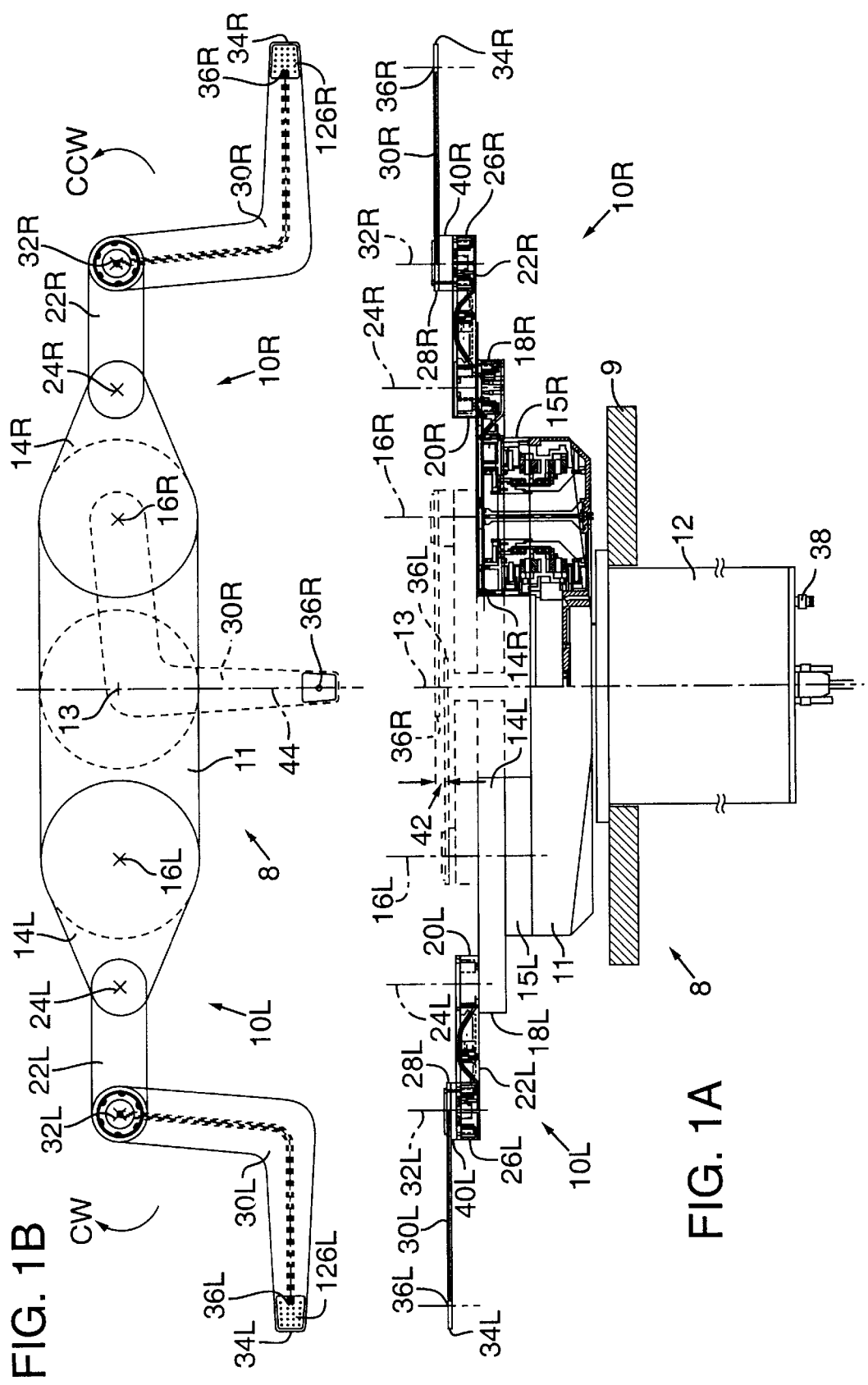
FIGS. 1A and 1B are respective side elevation and plan views of a two-arm, multiple link robot arm system of this invention partly cutaway to reveal internal components and showing in phantom lines offset hands in alternate positions.

FIGS. 1A and 1B show respective side elevation and plan views of a two-arm, multiple link robot arm system 8 mounted on and through an aperture in the top surface of a support table 9. Two similar but independently controllable threelink robot arm mechanisms 10L and 10R (hereafter "robot arm 10L", "robot arm 10R", or collectively "robot arms 10") are rotatably mounted at opposite ends of a torso link 11, which is mounted to the top surface of a base housing 12 for rotation about a central or torso axis 13.

Because they are substantially mirror images of each other, robot arms 10 have corresponding components identified by identical reference numerals followed by the respective suffices "L" and "R". Accordingly, the following discussion is mainly directed to the construction and operation of robot arm 10R but is similarly applicable to robot arm 10L.

Robot arm 10R comprises an upper arm 14R mounted to the top surface of a cylindrical spacer 15R, which is positioned on the right-hand end of torso link 11 for rotation about a shoulder axis 16R. Cylindrical spacer 15R provides room for the motors and certain other components of robot arm 10R, as will be described below. Upper arm 14R has a distal end 18R to which a proximal end 20R of a forearm 22R is mounted for rotation about an elbow axis 24R, and forearm 22R has a distal end 26R to which a proximal end 28R of an offset hand 30R is mounted for rotation about a wrist axis 32R. Offset hand 30R is equipped at its distal end 34R with a fluid pressure outlet 36R that preferably applies vacuum pressure supplied to robot arm 10R at an inlet 38 to securely hold a semiconductor wafer, compact disk, or other suitable specimen (not shown) in place on offset hand 30R.

Each of upper arm 14L and 14R; forearms 22L and 22R; and offset hands 30L and 30R are capable of continuous rotation about their respective shoulder axes 16L and 16R; elbow axes 24L and 24R; and wrist axes 32L and 32R. This continuous rotation is partly made possible because three-link robot arms 10 are slightly different in that offset hands 30L and 30R are spaced apart from respective forearms 22L and 22R by differently sized cylindrical spacers 40L and 40R. Referring to FIG. 1A, robot arms 10 are shown in dashed lines in alternate rotated positions in which distal ends 36L and 36R clear each other by a spacing 42, preferably 0.4 inch, that is determined by the relative axial lengths of cylindrical spacers 40L and 40R. Continuous rotation is also made possible by rotating fluid slip rings that are described in more detail with reference to FIGS. 5A and 5B.

Referring to FIG. 1B, robot arms 10 are also different in that offset hand 30L is sized and shaped as a "dog leg" bent in a clockwise ("CW") direction and offset hand 30R is sized and shaped as a "dog leg" bent in a counter-clockwise ("CCW") direction. This sizing and shaping allows offset hands 30L and 30R to be rotated (as shown in dashed lines for offset hand 30R) such that fluid pressure outlets 36L and 36R are each positionable along a common hand extension line 44 that preferably extends radially from torso axis 13. This makes it possible for each of robot arms 10 to position a specimen along common hand extension line 44 without requiring rotation of torso link 11. The right-angle dog leg shape of offset hands 30L and 30R is preferred, but is only one of many operative shapes and angles that are dependent on the particular robotic application. A semiconductor wafer positioning application is described with reference to FIG. 7.

Figure 2:
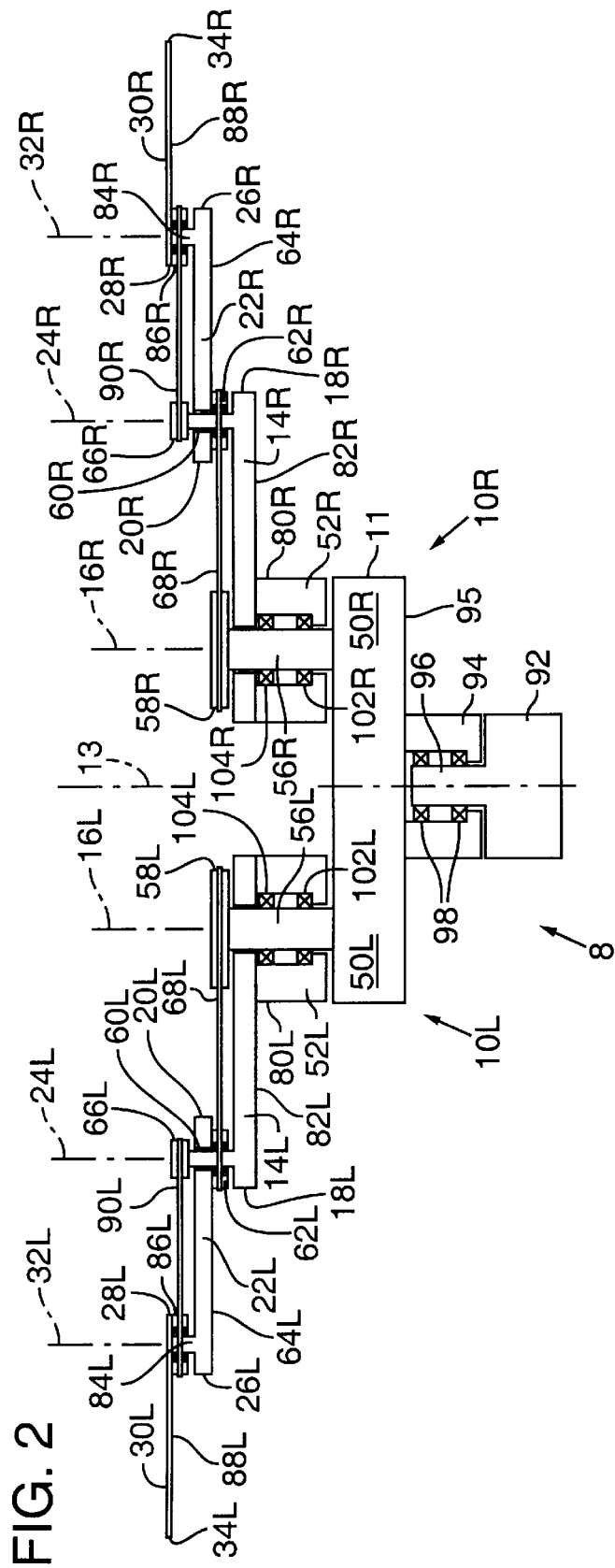
FIG. 2 is a side elevation view in stick diagram form showing the link components and the associated mechanical linkage of the robot arm system of FIGS. 1A and 1B.
Figure 6:
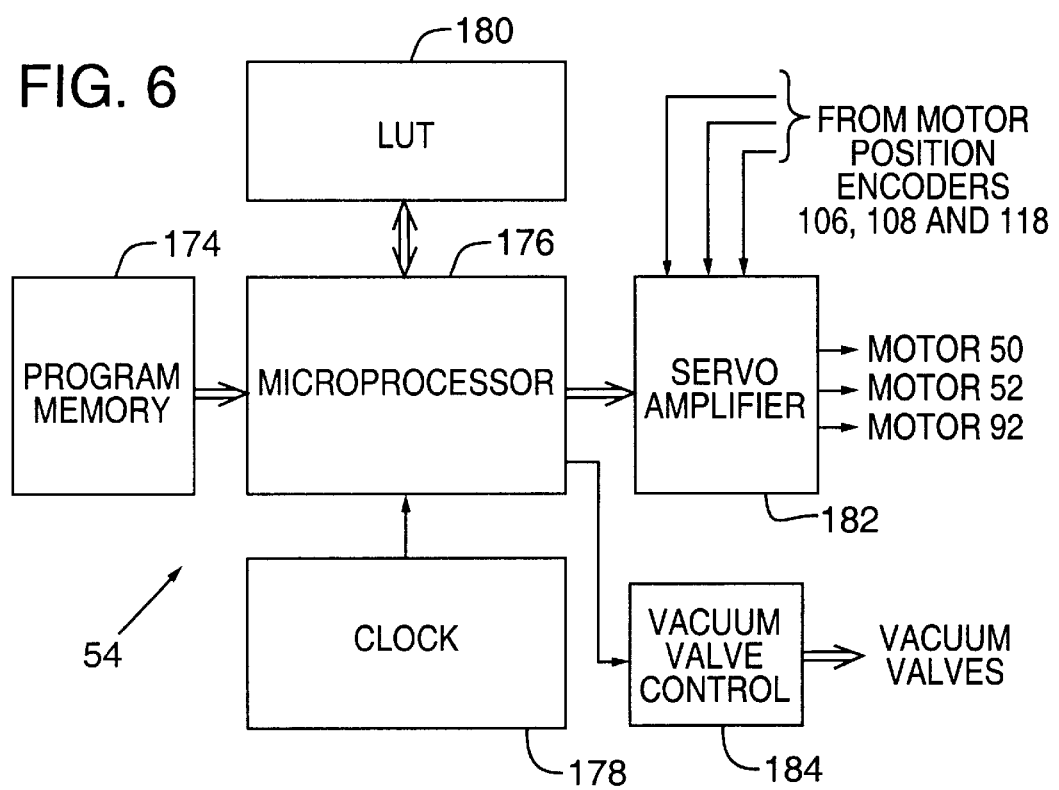
FIG. 6 is an electrical block diagram of the motor controller for the multiple link robot arm system of this invention.

FIG. 2 shows the link components and associated mechanical linkage of twoarm, multiple link robot arm system 8. In particular, robot arm 10R is positioned by first and second concentric motors 50R and 52R that operate in response to commands provided by a motor controller 54 (FIG. 6). First motor 50R rotates forearm 22R about elbow axis 24R, and second motor 52R rotates upper arm 14R about shoulder axis 16R.

More specifically, first motor 50R rotates a forearm spindle 56R that extends through an aperture in upper arm 14R and terminates in an upper arm pulley 58R. A post 60R extends upwardly at distal end 18R of upper arm 14R through the center of a bearing 62R that is mounted to a bottom surface 64R of forearm 22R at its proximal end 20R. Post 60R also extends through an aperture in forearm 22R and terminates in a forearm pulley 66R. An endless belt 68R connects upper arm pulley 58R and the outer surface of bearing 62R to rotate forearm 22R about elbow axis 24R in response to rotation of first motor 50R.

Second motor 52R rotates an upper arm spindle 80R that is mounted to a bottom surface 82R of upper arm 14R to rotate upper arm 14R about shoulder axis 16R. Coordinated operation of first and second motors 50R and 52R in conjunction with the mechanical linkage described below causes offset hand 30R to rotate about shoulder axis 16R. A post 84R extends upwardly through the center of a bearing 86R that is mounted to a bottom surface 88R of offset hand 30R. An endless belt 90R connects forearm pulley 66R to the outer surface of bearing 86R to rotate offset hand 30R about shoulder axis 16R in response to the coordinated rotational motions of motors 50R and 52R.

The mechanical linkage coupling upper arm 14R and forearm 22R forms an active drive link and a passive drive link. The active drive link includes belt 68R connecting upper arm pulley 58R and the outer surface of bearing 62R and causes forearm 22R to rotate in response to rotation of first motor 50R. The passive drive link includes belt 90R connecting forearm pulley 66R and the outer surface of bearing 86R and causes offset hand 30R to rotate about wrist axis 32R in response to rotation of forearm 22R about elbow axis 24R. Rotation of offset hand 30R can also be caused by a complex interaction among the active and passive drive links and the rotation of upper arm 14R in response to rotation of second motor 52R.

A third or torso motor 92 rotates a torso link spindle 94 that is mounted to a bottom surface 95 of torso link 11, to which robot arms 10 are rotatably mounted. A main ring 96 supports a bearing assembly 98 around which spindle 94 rotates. Motor 92 is capable of 360 degree continuous rotation about central axis 13 and therefore can, in cooperation with robot arm 10R, move offset hand 30R along an irregular path to any location within its reach.

Figure 3:
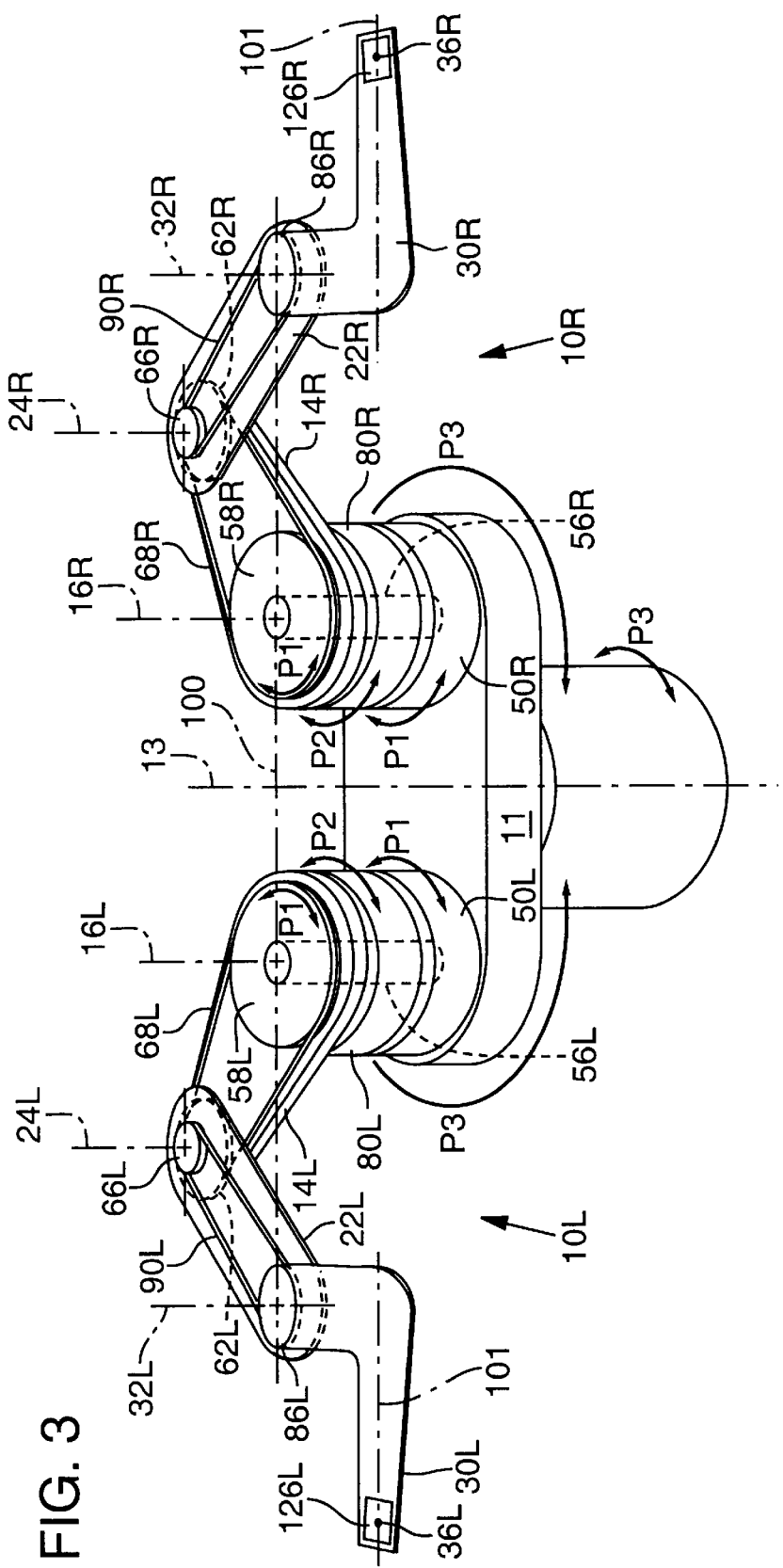
FIG. 3 is an isometric view in stick diagram form showing the rotational motion imparted by the motor drive links of the mechanical linkage of the robot arm system of FIGS. 1A and 1B.

Motor controller 54 (FIG. 6) controls motors 50R and 52R in two preferred operational states to enable robot arm 10R to perform two principal motion sequences. The first motion sequence changes the extension of offset hand 30R, and the second motion sequence changes the angular position of offset hand 30R relative to shoulder axis 16R. FIG. 3 is a useful diagram for showing the two motion sequences.

With reference to FIGS. 2 and 3, in the first operational state, motor controller 54 causes first motor 50R to maintain the position of forearm spindle 56R and second motor 52R to rotate upper arm spindle 80R. The non-rotation of first motor 50R maintains the position of upper arm pulley 58R, and the rotation of upper arm spindle 80R by second motor 52R rotates upper arm 14R about shoulder axis 16R, thereby causing rotation of forearm 22R about elbow axis 24R and counter-rotation of offset hand 30R about wrist axis 32R. Because the ratio of the diameters of upper arm pulley 58R and the outer surface of bearing 62R is 2:1 and the ratio of the diameters of forearm pulley 66R and the outer surface of bearing 86R is 1:2, the rotation of upper arm 14R in a direction specified by $P_2$ causes offset hand 30R to move parallel to a straight line path 100 that is radial to shoulder axis 16R. The 1:2:2:1 pulley ratios described are preferred, but are not the only ratios required to practice this invention. Because of the offset in offset hand 30R, fluid pressure outlet 36R moves along a straight line path 101 that is parallel to and offset from straight line path 100. The amount of offset is the same as the distance between torso axis 13 and shoulder axis 16R. Therefore, when fluid pressure outlet 36R is rotated into alignment with common hand extension line 44 (FIG. 1B), the first operational state, motor controller 54 causes fluid pressure outlet 36R to move along common hand extension line 44, which is preferably a perpendicular bisector between shoulder axes 16L and 16R.

Whenever upper arm 14R rotates in the CW direction specified by $P_2$, fluid pressure outlet 36R extends along straight line path 101. Whenever upper arm 14R rotates in the CCW direction specified by P2, fluid pressure outlet 36R retracts along straight line path 101. Of course, straight line path 101 is not limited to the one shown in FIG. 3 and may be any straight line path parallel to straight line path 100, which is determined by rotation of robot arm 10R in the second operational state as described below. Skilled persons will appreciate that robot arm 10L is a mirror image configuration of robot arm 10R and would, therefore, extend and retract in response to upper arm 14L rotation in directions opposite to those described. FIG. 1B shows that when robot arm 10R is fully extended, axes 13, 16R, 24R, and 32R are collinear.

In the second operational state, motor controller 54 causes first motor 50R to rotate forearm spindle 56R in the direction specified by $P_1$ and second motor 52R to rotate upper arm spindle 80R in the direction specified by $P_2$. In the special case in which motors 50R and 52R are synchronized to rotate in the same direction by the same amount of displacement, offset hand 30R, and thereby fluid pressure outlet 36R, is only angularly displaced about shoulder axis 16R. This is so because the rotation of forearm 22R about elbow axis 24R caused by the rotation of first motor 50R and the rotation of offset hand 30R about wrist axis 32R caused by rotation of second motor 52R and the operation of the passive drive link offset each other to produce no net rotation about elbow axis 24R and wrist axis 32R. Thus, fluid pressure outlet 36R is fixed radially at a point along straight line path 101 and describes a circular path as only upper arm 14R rotates about shoulder axis 16R. By application of kinematic constraints to achieve a desired travel path for fluid pressure outlet 36R, motor controller 54 can operate first and second motors 50R and 52R to move robot arm 10R along non-radial straight line paths, as will be further described below.

Skilled persons will appreciate that to operate robot arm 10R, first and second motors 50R and 52R are coupled by either rotating both of them or stopping one while rotating the other one. For example, robot arm 10R can be operated such that forearm 22R rotates about elbow axis 24R. Such motion would cause fluid pressure outlet 36R to describe a spiral path between shoulder axis 16R and the full extension of fluid pressure outlet 36R. This motion is accomplished by fixing the position of shoulder axis 14R and operating motor 50R to move forearm 22R. Applicants note that the prior art described in the background of the invention section is incapable of rotating the elbow joint without also rotating the shoulder joint, thereby requiring the operation of two motors.

Motor controller 54 also controls the operation of torso motor 92 and, therefore, the rotation of torso link 11 in a direction specified by $P_3$ independently of the operational states of motors 50R and 52R.

Figure 4A:
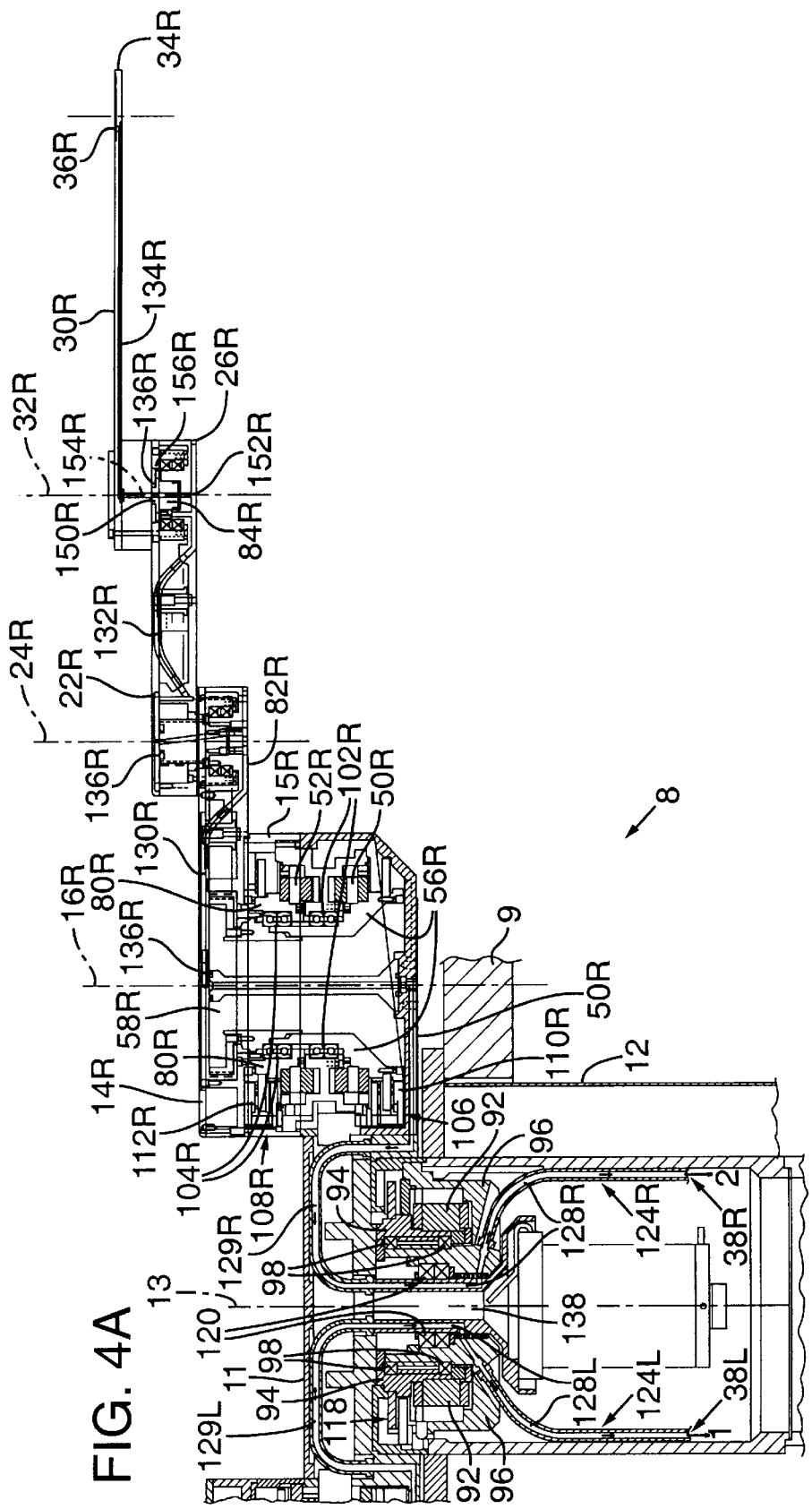
FIGS. 4A and 4B are respective cross-sectional and fragmentary plan views showing the interior components, mechanical linkage, and fluid pressure line paths of the robot arm system of FIGS. 1A and 1B.
Figure 4B:
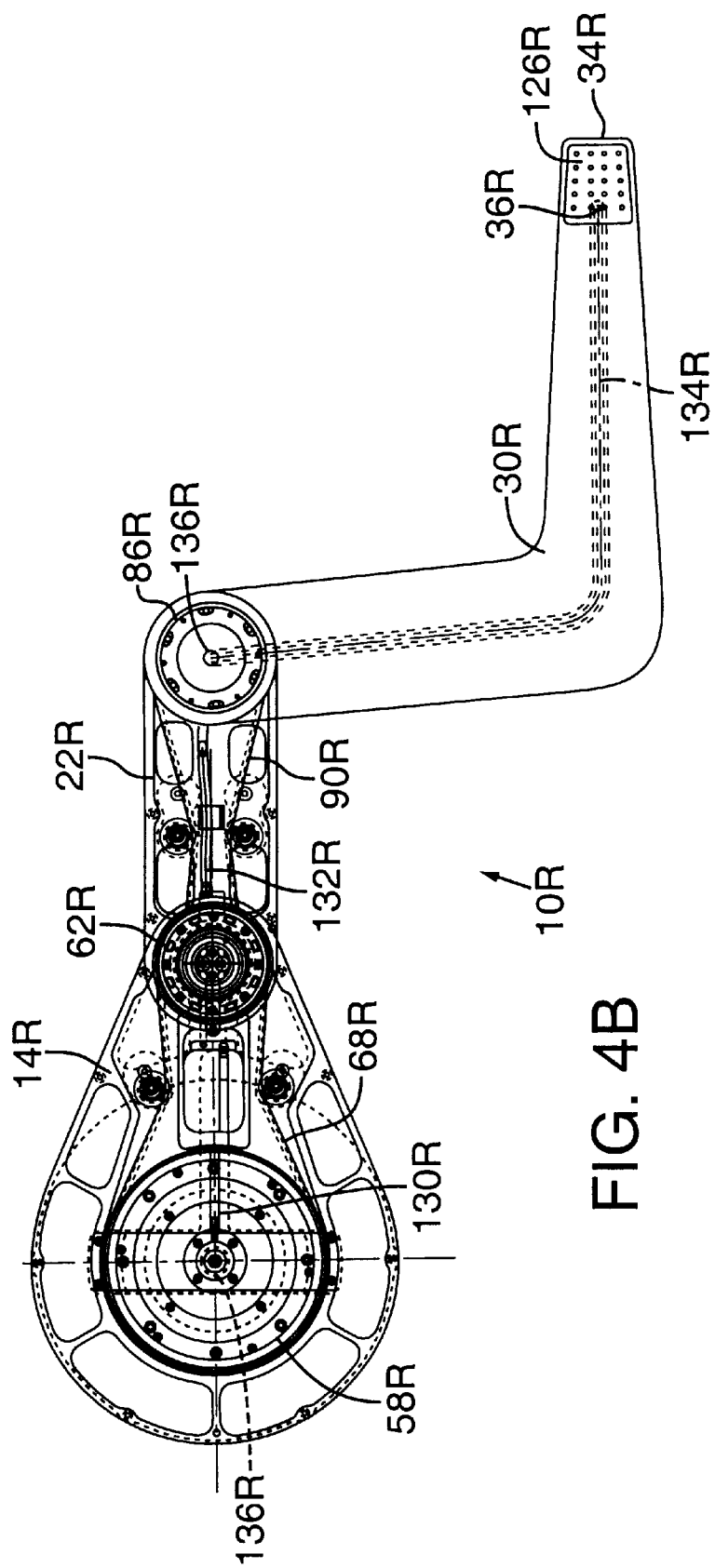

FIGS. 4A and 4B show the interior components, mechanical linkage, and fluid pressure conduits of robot arm 10R shown in FIGS. 1A and 1B. A motor housing composed of an interior portion of torso link 11 and cylindrical spacer 15R contains first motor 50R and second motor 52R arranged in concentric relation such that their respective forearm spindle 56R and upper arm spindle 80R rotate about shoulder axis 16R. Forearm spindle 56R is positioned nearer to shoulder axis 16R and is directly connected to upper arm pulley 58R journalled for rotation on bearings 102R. Upper arm spindle 80R is positioned farther radially from shoulder axis 16R and is directly connected to bottom surface 82R of upper arm 14R journalled for rotation on bearings 104R. The angular positions of motors 50R and 52R are tracked by respective glass scale encoders 106R and 108R. Encoders 106R and 108R include respective annular diffraction grating scales 10R and 112R and respective light source/detector subassemblies (not shown). Such glass scale encoders are known to skilled persons.

Base housing 12 contains motor 92, which is arranged such that torso link spindle 94 journalled on bearings 98 rotates about torso axis 13. The angular position of motor 92 is tracked by a glass scale encoder 118 of a type similar to encoders 106R and 108R.

Robot arm system 8 includes two separate fluid pressure conduits 124L and 124R each including multiple path segments, with conduit 124L extending between fluid pressure inlet 38L and fluid pressure outlet 36L of offset hand 30L and conduit 124R extending between fluid pressure inlet 38R and fluid pressure outlet 36R of offset hand 30R. In the preferred embodiment, the fluid pressure conduits deliver vacuum pressure but are capable of delivering positive amounts of fluid pressure. Each of path segments 128L and 128R in base housing 12 and of path segments 129L and 129R in torso link 11 is partly a flexible hose and partly a hole in a solid component.

Path segments 130R, 132R, and 134R in the respective upper arm 14R, forearm 22R, and offset hand 30R are partly flexible hose, channels formed by complementary depressions in mating components, or holes passing through solid components. Outlet 36R constitutes a hole in a vacuum land 126R on the specimen-contacting surface near distal end 34R of offset hand 30R.

Each path segment terminating or originating at shoulder axis 16R, elbow axis 24R, and wrist axis 32R includes a rotary fluid slip ring 136R (hereafter "136") that functions as a vacuum feedthrough conduit that permits continuous rotation about any one of these three axes. Path segments 128R and 129R are joined at torso axis 13 by a rotary multiple fluid-passageway spool 138, which rotates within bearing assembly 120 supported by main ring 96.

Figure 5A:
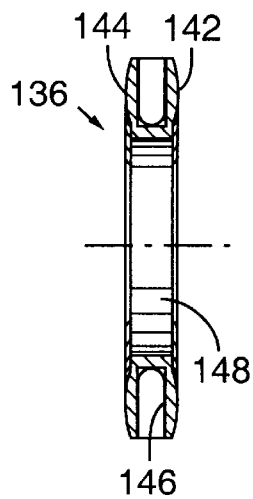
FIGS. 5A and 5B are respective side elevation and plan views of a rotary fluid slip ring installed at each rotary joint of the robot arm system of FIGS. 1A and 1B.
Figure 5B:
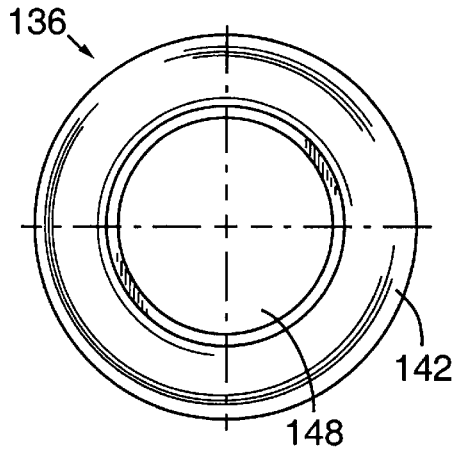

FIGS. 5A and 5B show rotary fluid slip ring 136, which is fitted into each of the rotary joints at shoulder axis 16R, elbow axis 24R, and wrist axis 32R. For purposes of convenience only, the following describes the operation of slip ring 136 in the rotary joint defining wrist axis 32R.

With reference to FIGS. 4A, 4B, 5A, and 5B, rotary fluid slip ring 136 includes a convex upper surface 142 and a convex lower surface 144 separated by an annular leaf spring 146. Each of surfaces 142 and 144 is preferably made of a reinforced Teflon® co-polymer and has a central aperture 148. When it is fitted in a rotary joint, slip ring 136 receives through central aperture 148 a protrusion 150R from the top surface of post 84R that extends from distal end 26R of forearm 22R. Protrusion 150R has a hole 152R that extends into and through post 84R along its entire length and is in fluid communication with vacuum path segment 132R within forearm 22R. The wrist joint formed by forearm 22R and offset hand 30R causes upper surface 142 to fit against an interior vacuum channel surface 154R of offset hand 30R and lower surface 144 to fit against a depression 156R in the top surface of post 84R. The raised upper and lower surfaces 142 and 144 compress against leaf spring 146 and form a vacuum seal for the space between the top of protrusion 150R and vacuum channel surface 154R of offset hand 30R. The reinforced copolymer material from which upper surface 142 is made forms a bearing surface that maintains a vacuum-tight seal during rotary motion about wrist axis 32R.

The mechanical construction of robot arm 10R does not restrict offset hand 30R to straight line motion but provides two degrees of freedom to achieve complex trajectories. This is beneficial because it facilitates specimen processing layouts to provide relatively small footprints and processing component placements that enhance ergonomic loading of specimens. However, a common application is to access specimens in straight line movements rather than complex hand movements because the specimen does not rotate when moving in a straight line. This is particularly beneficial for perpendicularly delivering and retrieving square, rectangular, or polygonal specimens to and from the openings or channels of a specimen carrier or processing station.

FIG. 6 is a simplified block diagram showing the primary components of motor controller 54. Motor controller 54 includes a program memory 174 that stores move sequence instructions for robot arm 10R. A microprocessor 176 receives from program memory 174 the move sequence instructions and interprets them to determine whether the first or second operational state is required or whether motion of motor 92 is required to rotate torso link 11. A system clock 178 controls the operation of microprocessor 176. A look-up table ("LUT:) 180 stores corresponding rotational values for motors 50R and 52R to accomplish the straight line motion of the first operational state and the angular motion of the second operational state. Because the rotation of torso link 11 is independent of the motions of the robot arms mounted to it, the overall coordination of the angular displacement of motor 92 with the angular displacements of motors 50R and 52R is carried out in the move sequence instructions, not in LUT 180. This results in higher speed and more accurate straight line motion because multiple axis servomechanism following errors and drive accuracy errors do not affect the straight line path of offset hand 30R. Microprocessor 176 provides position signals to a servomechanism amplifier 182, which delivers drive signals to motors 52R and 50R, respectively. Microprocessor 176 also provides position signals to servomechanism amplifier 176 to deliver a drive signal to torso motor 92. Servomechanism amplifier 182 receives from glass scale encoders 106, 108, and 118 signals indicative of the angular positions of the respective motors 50R, 52R, and 92.

Microprocessor 176 also provides control signals to a vacuum valve controller 184, which causes a vacuum valve (not shown) to provide from a vacuum source (not shown) an appropriate amount of vacuum pressure to fluid pressure outlet 36R in response to the need to hold a wafer on or release a wafer from offset hand 30R.

FIG. 7 shows two-arm, multiple link robot arm system 8 employed in an examplary semiconductor wafer processing application in which an operator 200 loads a wafer cassette 202 onto a pedestal 204 that is attached at a predetermined Z-axis elevation to support table 9. Wafer cassette 202 is filled with a separated stack of wafers 206 that robot arm 10R retrieves one at a time, places on a processing station 208, and returns to wafer cassette 202, or another wafer cassette (not shown), after processing. Although FIG. 7 shows only one wafer cassette and processing station, multiple wafer cassettes and/or processing stations are typically positioned within the reach of multiple link robot arm system 8 to improve wafer processing throughput.

Retrieving a particular one of wafers 206 from wafer cassette 202 further entails moving robot arm 10R in the first operation state in a Z-axis direction such that offset hand 30R can be moved in a +Y-axis direction to a position elevationally slightly below any selected one of wafers 206 and then up into contact with it. (FIG. 7 shows robot arm 10R in solid and dashed lines in respective fully lowered and fully raised Z-axis positions.) Vacuum valve controller 184 (FIG. 6) then applies vacuum pressure to vacuum pressure outlet 36R to secure the selected one of wafers 206 to offset hand 30R. Offset hand 30R is then withdrawn in the first operational state in a -Y-axis direction from wafer cassette 202, moved to a Z-axis elevation slightly above a specimen receiving platform 210 on processing station 208, and rotated about shoulder axis 16R in the second operational state to position the particular one of wafers 206 for delivery to specimen receiving platform 210. Exemplary wafer retrieval and delivery operations are described in more detail with reference to FIGS. 8 and 9.

Z-axis positioning of robot arm 10R may be accomplished by any one of a number of well-known positioning mechanisms, but preferably employs a vacuum pressure counter-balanced, lead screw driven, track and rail elevator system such as the one described in copending U.S. patent application Ser. No. 08/824,777 for UNITARY SPECIMEN PREALIGNER AND CONTINUOUSLY ROTATABLE MULTIPLE LINK ROBOT ARM MECHANISM, which is assigned to the assignee of this application.

FIGS. 8A through 8D show two-arm, multiple link robot arm system 8 employed in an exemplary semiconductor wafer prealigning application in which a wafer cassette 220 and a wafer cassette 222 each have channels for storing multiple 304.8 millimeter (12 inch) diameter semiconductor wafers. Individual ones of the wafers are retrieved and delivered as described with reference to FIG. 7.

In the example shown, a number of alternative wafer retrieval and delivery applications are possible.

A first alternative application includes providing wafer cassette 220 with a full load of arbitrarily oriented wafers and providing wafer cassette 222 in an empty condition. Robot arm 10L retrieves the arbitrarily oriented wafers from wafer cassette 220, places them on a prealigner 224 for manipulation into a predetermined orientation, and robot arm 10R retrieves the wafers from prealigner 224 and delivers them to wafer cassette 222 in the predetermined orientation.

A second alternative application includes providing both wafer cassette 220 and wafer cassette 222 with a full load of arbitrarily oriented wafers. Robot arm 10L retrieves the arbitrarily oriented wafers from wafer cassette 220, places them on a prealigner 224 for manipulation into a predetermined orientation, and returns them to wafer cassette 220 in the predetermined orientation. Likewise, robot arm 10R retrieves the arbitrarily oriented wafers from wafer cassette 222, places them on a prealigner 224 for manipulation into a predetermined orientation, and returns them to wafer cassette 222 in the predetermined orientation.

Of course, robot arms 10L and 10R may operate alternately to share prealigner 224, may operate singly to prealign batches of wafers from either wafer cassette 220 or 222, or may operate in a combination of the above modes.

In particular regarding FIGS. 8A through 8D, a torso rotational axis 225 is defined by a line running between shoulder axes 16L and 16R. Torso link 11 is rotated to align torso rotational axis 225 with an X-axis. Wafer cassettes 200 and 222 are positioned such that a line connecting effective centers 226 and 228 of wafers 230 and 232 is parallel to the X-axis. Effective centers 226 and 228 are spaced apart by an optimal spacing 234 of 530 millimeters (20.866 inches) and are spaced away from torso rotational axis 225 by a distance 236 of 408.95 millimeters (16.1 inches). Prealigner 224 has a rotational axis 238 that is positioned on common hand extension line 44 and spaced away from torso rotational axis 225 by 408.95 millimeters (16.1 inches). Common hand extension line 44 is preferably perpendicular to torso rotational axis 225 and bisects shoulder axes 16L and 16R. Offset hands 30 each have an offset distance 240 that is equal to the distance between torso axis 13 and shoulder axis 16. In this example, offset distance 240 is preferably 132.5 millimeters (5.216 inches).

Figure 8A:
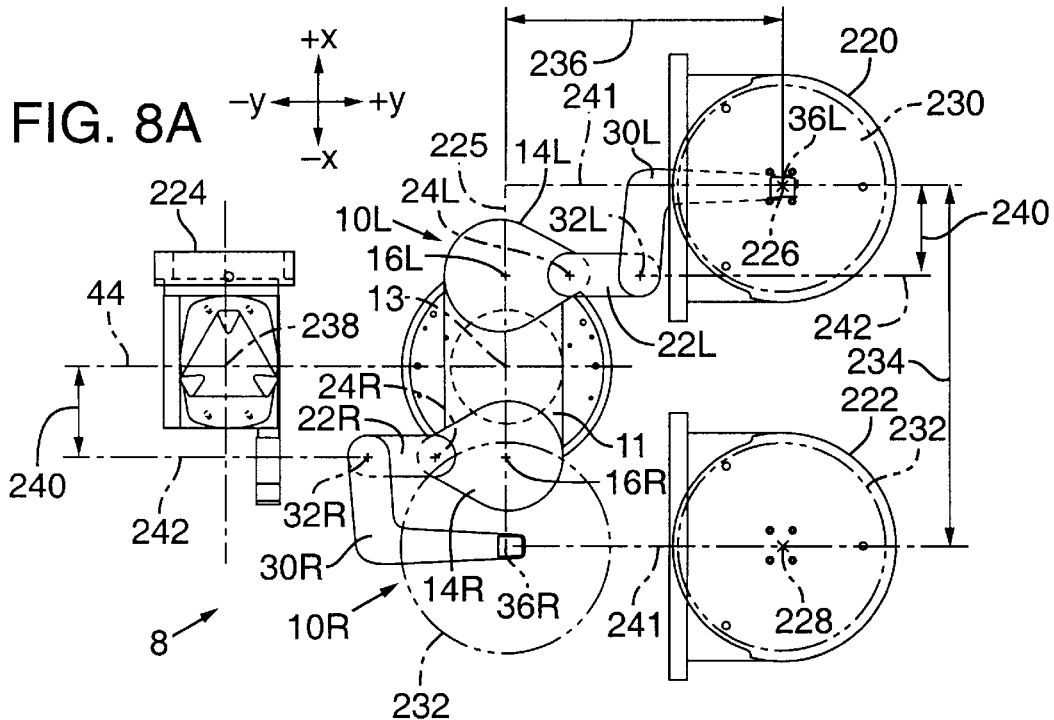

FIG. 8A shows robot arms 10L and 10R in respective fully extended and fully retracted positions such that offset hands 30L and 30R are in perpendicular alignment with the openings of the respective wafer cassettes 220 and 222. Wafer 232 is shown in respective alternate delivered (or stored) and retrieved positions. Linear extension and retraction of either arm is accomplished by upper arm 14 and forearm 22 cooperatively rotating in the first operational state of motor controller 54 to linearly extend offset hand 30 along an offset linear path 241 so as to reach and retrieve a wafer. To accomplish full extension or retraction, upper arm 14 rotates 180 degrees about shoulder axis 16. When fully extended or retracted, axes 16, 24, and 32 are collinear and form a collinear axis 242, which is a linear path along which wrist axis 32 moves. Offset distance 240 may be further defined as the perpendicular distance between collinear axis 242 and fluid pressure outlet 36 of offset hand 30.

Figure 8B:
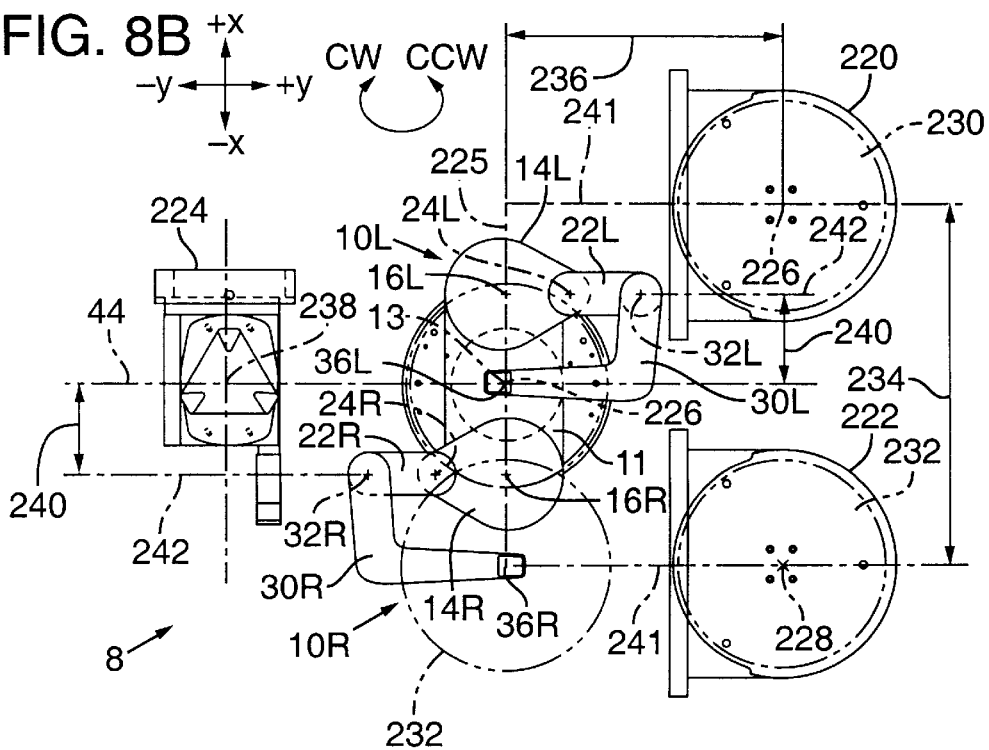

FIG. 8B shows robot arm 10L in a fully retracted position, as described in FIG. 8A for robot arm 10R, and cooperatively rotated in the second operational state of motor controller 54 to rotate robot arm 10L 180 degrees CCW about shoulder axis 16L such that effective center 226 of wafer 230 is substantially aligned with torso axis 13. CCW rotation is necessary to prevent interference between wafer 230 and wafer cassette 220. The opposite rotational sense would apply for related movements of robot arm 10R.

FIG. 8C shows robot arm 10L in a half extended position during the process of delivering wafer 230 to prealigner 224. During this process, upper arm 14L and forearm 22L cooperatively rotate about 90 degrees in the first operational state of motor controller 54 to linearly extend offset hand 30L such that effective center 226 of wafer 230 follows common hand extension line 44 toward rotational axis 238 of prealigner 224.

FIG. 8D shows robot arm 10L fully extended such that effective center 238 of wafer 230 is substantially centered over rotational axis 238 of prealigner 224. Full extension of robot arm 10L occurs when upper arm 14L and forearm 22L cooperatively rotate about another 90 degrees in the first operational state of motor controller 54 to linearly extend offset hand 30L.

This example demonstrates that robot arm system 8 is advantageous because it can make quick wafer exchanges between stations in a reduced footprint layout without requiring any time-consuming torso rotations. Robot arm system 8 is further advantageous because offset hands 30L and 30R have a Z-axis spacing 42 that enables their simultaneous movement to increase prealigning throughput of wafers 220 and 222.

However, a disadvantage of the example shown in FIGS. 8A through 8D is that optimal spacing 234 must be matched to the overall width of robot arm system 8, which is defined as the distance between shoulder axes 16 plus two times the offset distance 240. Ordinarily, this disadvantage requires providing multiple different models of robot arm system 8, each having a different overall width.

Figure 9:
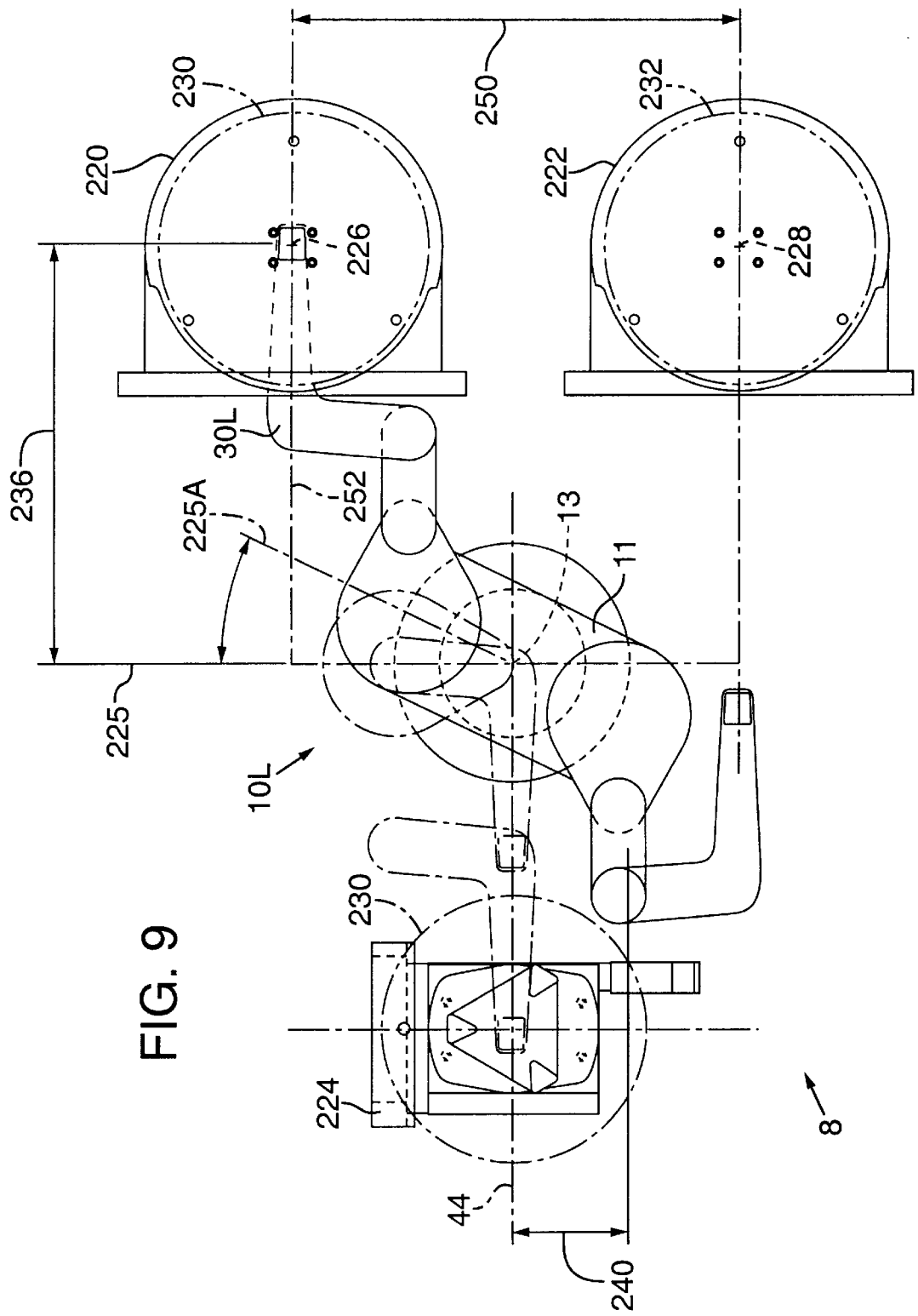
FIG. 9 shows typical positions of the two-arm, multiple link robot arm system of FIGS. 1A and 1B as it retrieves semiconductor wafers from two nonoptimally spaced apart, side-by-side wafer cassettes for placement of the wafers at a processing station location while employing a torso link rotation to accommodate the nonoptimal wafer cassette spacing.

FIG. 9 shows how a single overall width model of robot arm system 8 can overcome this disadvantage. In this example, effective centers 226 and 228 of wafers 230 and 232 are spaced apart by a nonoptimal spacing 250 of 505 millimeters (19.882 inches). To compensate for the reduced nonoptimal spacing 250, torso link 11 rotates to a torso rotational axis 225A that is angularly offset 25.09 degrees CW from torso rotational axis 225. This rotation of torso link 11 allows offset hand 30L to extend perpendicularly into the opening in wafer cassette 220. However, the additional extension distance caused by the rotation of torso link 11 should be compensated for by increasing distance 236 to 465.12 millimeters (18.31 inches).

In this example, after wafer 230 is retrieved from wafer cassette 230, torso link 11 rotates 25.09 degrees CCW into realignment with torso rotational axis 225. Wafer 230 may then be delivered to and retrieved from prealigner 224 as described with reference to FIGS. 8B, 8C, and 8D and shown in dashed lines in FIG. 9.

An advantage of torso rotation is that it compensates for various cassette spacings without need for a customized overall width of robot arm system 8.

It will be obvious to those having skill in the art that many changes may be made to the details of the above-described embodiment of this invention without departing from the underlying principles thereof. For example, to the degree they will fit, more or fewer wafer cassettes, specimen carriers, and processing stations may be positioned around torso axis 13 within the offset reach of offset hands 30. The above-described applications, examples, and related dimensions are merely exemplary and may, therefore be adapted to many different applications. For example, offset hand 30 is not restricted to having a substantially right-angled dog leg shape, and the offset need not be parallel to the extended links. Moreover, the offset distance need not be the same for each offset hand as long as a common extension line can be followed. Indeed, only one robot arm requires an offset hand. In the examples shown, offset distance 240 is about one-fourth the extended length of robot arm 10, but this is a special case that improves specimen exchanging throughput and reduces the system footprint. It is further envisioned that this invention may include a processing station, such as a prealigner, integrated and moving with the torso. Also, a single robot arm embodiment would have effective applications. Of course, specimens other than semiconductor wafers can be adapted for use with this invention. The scope of this invention should, therefore, be determined only by the following claims.

We claim:

1. A robot arm system for moving specimens having effective centers among first and second specimen storage cassettes and a specimen processing station, the robot arm system including first and second robot arm mechanisms rotatable about respective first and second shoulder axes and each operable to move respective first and second wrist axes along linear paths that extend radially from the respective first and second shoulder axes, the first and second robot arm mechanisms further operable to angularly shift the respective first and second wrist axes about the respective first and second shoulder axes such that the linear paths are shiftable about the first and second shoulder axes, an improvement comprising:

a first offset hand extending from the first wrist axis for grasping the effective center of one of the specimens such that when the first robot arm mechanism moves the first wrist axis along a first linear path, the effective center of the specimen moves along a first offset linear path that is parallel to and spaced apart a first offset distance from the first linear path, and when the first robot arm mechanism shifts the first wrist axis into coincidence with a second linear path, the first offset hand is movable along a second offset linear path that is parallel to and spaced apart the first offset distance from the second linear path;

a second offset hand extending from the second wrist axis for grasping the effective center of one of the specimens such that when the second robot arm mechanism moves the second wrist axis along a third linear path, the effective center of the specimen moves along a third offset linear path that is parallel to and spaced apart a second offset distance from the third linear path, and when the second robot arm mechanism shifts the second wrist axis into coincidence with a fourth linear path, the second offset hand is movable along a fourth offset linear path that is parallel to and spaced apart the second offset distance from the fourth linear path; and the first and second shoulder axes being spaced apart such that the second offset linear path can substantially share a common linear path with the fourth offset linear path.

2. The system of claim 1 in which the first offset distance is substantially equal to the second offset distance.

3. The system of claim 1 in which the specimen processing station is positioned along the common linear path.

4. The system of claim 1 in which the first and second shoulder axes are on a line and the common linear path is a perpendicular bisector of the line.

5. The system of claim 4 in which the first and second specimen storage cassettes are aligned in a side-by-side relationship and parallel to the line.

6. The system of claim 1 in which at least one of the specimen storage cassettes is placed such that the specimens may be retrieved or delivered thereto by movement of a respective one of the first and second offset hands along a respective one of the first and third offset linear paths.

7. The system of claim 1 in which at least one of the first and second offset hands comprises an elongated dog leg shaped member.

8. The system of claim 7 in which the elongated dog leg shaped member forms about a 90 degree bend.

9. The system of claim 7 in which the first and second offset hands form dog leg shapes that are bent in opposite rotational directions.

10. The system of claim 1 in which the first and second offset hands are spaced apart from each other in a direction parallel to the first and second shoulder axes to prevent a mechanical interference when at least one of the first and second offset hands undergoes movement in a region of the common linear path.

11. The system of claim 1 further including a torso link operable for rotation about a central axis and on which the first and second robot arm mechanisms are mounted for rotation about the respective first and second shoulder axes, which axes are spaced apart from each other and offset from the central axis.

12. The system of claim 11 in which the torso link is an elongated element that has opposite ends and the first and second robot arm mechanisms are positioned near the opposite ends of the torso link.

13. The system of claim 11 in which a rotation of the torso link about the central axis causes a repositioning of the first and second shoulder axes, which repositioning allows moving the specimens along respective fifth and sixth offset linear paths.

14. The system of claim 13 in which the first and second specimen storage cassettes are aligned in a side-by-side relationship on a line perpendicular to the common linear path and spaced apart from the central axis, and in which at least one of the first and second specimen storage cassettes is placed such that the specimens may be retrieved or delivered thereto by movement of at least one of the first and second offset hands along a respective one of the fifth and sixth offset linear paths.

15. In a robot arm system including first and second robot arm mechanisms rotatable about respective first and second shoulder axes and each operable to move respective first and second wrist axes along linear paths that extend radially from the respective first and second shoulder axes, the first and second robot arm mechanisms further operable to angularly shift the respective first and second wrist axes about the respective first and second shoulder axes such that the linear paths are shiftable about the first and second shoulder axes, a method for moving specimens having effective centers among first and second specimen storage cassettes and a specimen processing station comprising:

providing a first offset hand extending from the first wrist axis for grasping the effective center of one of the specimens such that when the first robot arm mechanism moves the first wrist axis along a first linear path, the effective center of the specimen moves along a first offset linear path that is parallel to and spaced apart a first offset distance from the first linear path, and when the first robot arm mechanism shifts the first wrist axis into coincidence with a second linear path, the first offset hand is movable along a second offset linear path that is parallel to and spaced apart the first offset distance from the second linear path;

providing a second offset hand extending from the second wrist axis for grasping the effective center of one of the specimens such that when the second robot arm mechanism moves the second wrist axis along a third linear path, the effective center of the specimen moves along a third offset linear path that is parallel to and spaced apart a second offset distance from the third linear path, and when the second robot arm mechanism shifts the second wrist axis into coincidence with a fourth linear path, the second offset hand is movable along a fourth offset linear path that is parallel to and spaced apart the second offset distance from the fourth linear path; and spacing apart the first and second shoulder axes such that the second offset linear path can substantially share a common linear path with the fourth offset linear path.

16. The method of claim 15 in which the first offset distance is substantially equal to the second offset distance.

17. The method of claim 15 further including positioning the specimen processing station along the common linear path.

18. The method of claim 15 in which the first and second shoulder axes are on a line and the common linear path is a perpendicular bisector of the line.

19. The method of claim 18 further including aligning the first and second specimen storage cassettes in a side-by-side relationship and parallel to the line.

20. The method of claim 15 further including placing at least one of the specimen storage cassettes such that the specimens may be retrieved or delivered thereto by movement of a respective one of the first and second offset hands along a respective one of the first and third offset linear paths.

21. The method of claim 15 shaping at least one of the first and second offset hands as an elongated dog leg shaped member.

22. The method of claim 21 in which the elongated dog leg shaped member forms about a 90 degree bend.

23. The method of claim 21 further including providing the first and second offset hands with elongated dog leg shaped members and forming the dog leg shaped members such that they are bent in opposite rotational directions.

24. The method of claim 15 further including spacing the first and second offset hands apart from each other in a direction parallel to the first and second shoulder axes to prevent a mechanical interference when at least one of the first and second offset hands undergoes movement in a region of the common linear path.

25. The method of claim 15 further including providing a torso link operable for rotation about a central axis, and mounting the first and second robot arm mechanisms in the torso link such that the first and second shoulder axes are spaced apart from each other and offset from the central axis.

26. The method of claim 25 further including forming the torso link as an elongated element that has opposite ends, and positioning the first and second robot arm mechanisms near the opposite ends of the torso link.

27. The method of claim 25 further including rotating the torso link about the central axis to reposition the first and second robot arm mechanisms, and operating the first and second robot arm mechanisms to move the specimens along respective fifth and sixth offset linear paths that are more closely spaced apart than the first and third offset linear paths.

28. The method of claim 27 further including aligning the first and second specimen storage cassettes in a side-by-side relationship on a line perpendicular to the common linear path and spaced apart from the central axis, and spacing the first and second specimen storage cassettes apart such that the specimens may be retrieved or delivered thereto by movement of the first and second offset hands along respective ones of the fifth and sixth offset linear paths.

29. The method of claim 25 further including:

aligning the first and second specimen storage cassettes in a side-by-side relationship on a line perpendicular to the common linear path and spaced apart from the central axis;

rotating the torso link about the central axis to align at least one of the first and second offset hands with the effective center of a specimen stored in a respective one of the first and second specimen storage cassettes; and moving at least one of the first and second offset hands along an offset linear path to retrieve the specimen stored in the respective one of the first and second specimen storage cassettes.

* * * * *